United States Patent
Kumar et al.

(10) Patent No.: US 11,463,000 B2
(45) Date of Patent: Oct. 4, 2022

(54) POWER TRANSFER OVER AN ISOLATED CAPACITIVE BARRIER WITH CONTROLLED CURRENT

(71) Applicant: TEXAS INSTRUMENTS INCORPORATED, Dallas, TX (US)

(72) Inventors: Ashish Kumar, Santa Clara, CA (US); Haoquan Zhang, Cambridge, MA (US); Yogesh Kumar Ramadass, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 17 days.

(21) Appl. No.: 17/138,660

(22) Filed: Dec. 30, 2020

(65) Prior Publication Data
US 2021/0305893 A1  Sep. 30, 2021

Related U.S. Application Data

(60) Provisional application No. 63/000,210, filed on Mar. 26, 2020.

(51) Int. Cl.
| | | |
|---|---|---|
| *H02M 3/07* | (2006.01) | |
| *G01D 11/00* | (2006.01) | |
| *H03M 1/12* | (2006.01) | |
| *H02J 50/05* | (2016.01) | |

(52) U.S. Cl.
CPC .............. *H02M 3/07* (2013.01); *G01D 11/00* (2013.01); *H02J 50/05* (2016.02); *H03M 1/12* (2013.01)

(58) Field of Classification Search
None
See application file for complete search history.

(56) References Cited

U.S. PATENT DOCUMENTS

| | | | |
|---|---|---|---|
| 10,340,794 B1 * | 7/2019 | Zhang | H02M 1/08 |
| 10,530,249 B1 * | 1/2020 | Lee | H02M 1/08 |
| 2017/0288531 A1 * | 10/2017 | Ribeiro do Nascimento | H02M 3/07 |
| 2020/0259351 A1 * | 8/2020 | Coleman | H02J 3/34 |

* cited by examiner

*Primary Examiner* — Cassandra F Cox
(74) *Attorney, Agent, or Firm* — Michael A. Davis, Jr.; Charles A. Brill; Frank D. Cimino

(57) ABSTRACT

Capacitively isolated current-loaded or current-driven charge pump circuits and related methods transfer electrical energy from a primary side to a secondary side over a capacitive isolation boundary, using a controlled current source to charge isolation capacitors with constant current, as opposed to current impulses, while maintaining output voltage within tolerance. The charge pump circuits provide DC-to-DC converters that can be used in isolated power supplies, particularly in low-power applications and in such devices as sensor transmitters that have separate electrical ground planes. The devices and methods transfer electrical energy over an isolated capacitive barrier in a manner that is efficient, inexpensive, and reduces electromagnetic interference (EMI).

15 Claims, 12 Drawing Sheets

POWER TRANSFER OVER AN ISOLATED CAPACITIVE BARRIER WITH CONTROLLED CURRENT

CROSS-REFERENCE TO RELATED APPLICATION

This application claims priority to U.S. provisional patent application No. 63/000,210 filed Mar. 26, 2020.

TECHNICAL FIELD

This description relates generally to electronic circuits, and more particularly to power transfer over an isolated capacitive barrier with controlled current.

BACKGROUND

In factory automation and industrial process control, process variables such as temperature, pressure, flow, level, or valve status, to name only a few examples, can be monitored and maintained at appropriate levels in order to take decisions and drive actions, such as may be needed to provide suitable production or storage environments or to further production processes and goals. A sensor transmitter may either continuously or periodically measure such vital parameters as these and transmit them, wired or wirelessly, from a field level where measurements take place, to one or more devices on a higher control level, such as to a programmable logic controller (PLC), a programmable automation controller (PAC), a human-machine interface (HMI), a distributed control system (DCS), a supervisory control and data acquisition (SCADA) system, or a data recorder, as examples. Each of these may in turn be linked to systems on a still higher enterprise level, such as a personal computer (PC) or automation server, which may provide control directives and programming to down-level devices at the control level. At the control level or enterprise level, sensor measurements from one or more sensor transmitters may be processed to determine control actions to be taken, which may include, for example, activating or adjusting one or more heaters or coolers to effect temperature changes, adjusting valves to alter pressures, levels, or flows, or to other electromechanical actuators, as examples.

A sensor transmitter may be packaged with or arranged nearby and coupled to a sensor for the purpose of interfacing the sensor to ethernet, RS-485, a controller area network (CAN), or other fieldbuses, or a system for wireless transmission such as may make use of IEEE 802.11 Wi-Fi, Bluetooth, or another wireless protocol. Within a sensor transmitter, an analog-to-digital converter (ADC) may be provided in an analog front-end to convert analog sensor signals to digital signals for transmission up-level. Safety considerations or system design robustness considerations may call for there to be an isolation barrier between the ADC and the interface or fieldbus. The isolation barrier may be configured so as to transfer signals and/or power from the interface or fieldbus side to the analog front-end, such as may be needed to power the ADC and/or the attached sensor.

SUMMARY

An example capacitively isolated current-loaded charge pump circuit is configured to transfer electrical energy from a primary side to a secondary side over a capacitive isolation boundary. The charge pump circuit includes an input capacitor coupled at a first end to a primary upper terminal and at a second end to a primary ground terminal on the primary side. The charge pump circuit further includes an output capacitor coupled at a first end to a secondary upper terminal and at a second end to a secondary ground terminal on the secondary side. The charge pump circuit further includes a primary switching bridge on the primary side, the primary switching bridge comprising a first primary switch coupled to a second primary switch at a first primary terminal and a third primary switch coupled to a fourth primary switch at a second primary terminal. The charge pump circuit further includes a secondary switching bridge on the secondary side, the secondary switching bridge comprising a first secondary switch coupled to a second secondary switch at a first secondary terminal and a third secondary switch coupled to a fourth secondary switch at a second secondary terminal. The charge pump circuit further includes a first isolation capacitor coupled at a first end to the first primary terminal and at a second end to the first secondary terminal. The charge pump circuit further includes a second isolation capacitor coupled at a first end to the second primary terminal and at a second end to the second secondary terminal. The charge pump circuit further includes at least one of a secondary-side controlled current source coupled between the secondary switching bridge and the output capacitor and configured to maintain an output voltage across the output capacitor to within a tolerance, and to maintain current through the first and second isolation capacitors as a square wave, or a primary-side controlled current source coupled between the primary switching bridge and the input capacitor and configured to maintain a primary-side voltage across the primary switching bridge to within a tolerance, and to maintain current through the first and second isolation capacitors as a square wave. The primary and secondary switching bridges are configured to coordinately switch to transfer electrical energy from the primary side to the secondary side.

Another example includes a method of power transfer over an isolated capacitive barrier with controlled current. Current through a first isolation capacitor of the barrier is controlled with a controlled current source during a first portion of an operation period of a charge pump to charge the first isolation capacitor with an about constant current during the first portion. Current through a second isolation capacitor of the barrier is controlled with the controlled current source during a second portion of the operation period of the charge pump to charge the second isolation capacitor with an about constant current during the second portion. During each of the first and second portions of the operation period, the controlled current source is controlled in one of two ways, based on whether the controlled current source is located on the input side of the barrier or on the output side of the barrier. If the controlled current source is located on the output side of the barrier, it is controlled to maintain an output voltage provided on an output side of the barrier to within a tolerance. Alternatively, if the controlled current source is located on the input side of the barrier, it is controlled to maintain a voltage across a first switching bridge located on an input side of the barrier to within a tolerance.

Another example provides a sensor transmitter comprising an interface or fieldbus, an analog front-end, and an isolation barrier therebetween. The interface or fieldbus includes one or more terminals adapted to be coupled to an up-level connector that is adapted to be coupled to an up-level process controller or signal processor, power supply circuitry, a primary switching bridge having an input coupled to a power output of the power supply circuitry, and an input capacitor coupled at a first end to the input of the primary switching bridge and at a second end to a primary ground terminal. The analog front-end includes an integrated sensing element or one or more terminals adapted to be coupled to a sensor connector that is adapted to be coupled to an external sensor and to receive an analog signal from the external sensor, an ADC coupled at an analog input to the integrated sensing element or the sensor connector, a secondary switching bridge having an output coupled to the ADC to provide electrical power to the ADC, and an output capacitor coupled at a first end to the output of the secondary bridge and at a second end to a secondary ground terminal. The analog front-end is isolatedly coupled to the interface or fieldbus over the isolation barrier via first and second isolation capacitors. The sensor transmitter includes at least one of a controlled current source coupled between the secondary switching bridge and the output capacitor and configured to maintain an output voltage across the output capacitor to within a tolerance, and to maintain current through the first and second isolation capacitors as a square wave, or a controlled current source coupled between the primary switching bridge and the input capacitor and configured to maintain a primary-side voltage across the primary switching bridge to within a tolerance, and to maintain current through the first and second isolation capacitors as a square wave.

DETAILED DESCRIPTION

A number of example device applications, such as sensor transmitters, involve delivery of electrical power to a portion of a device having a separate electrical ground from the electrical ground of the portion of the device from which the power is delivered. The devices and methods of this description relate to transfer of electrical energy over an isolated capacitive barrier in a manner that is efficient, inexpensive, and reduces electromagnetic interference (EMI). The devices and methods of the present application provide a DC-DC supply that has isolation and can also regulate its output voltage. In particular, this description describes an isolated power supply for use in, for example, supplying power to an analog-to-digital converter in a sensor transmitter.

Figure 1:
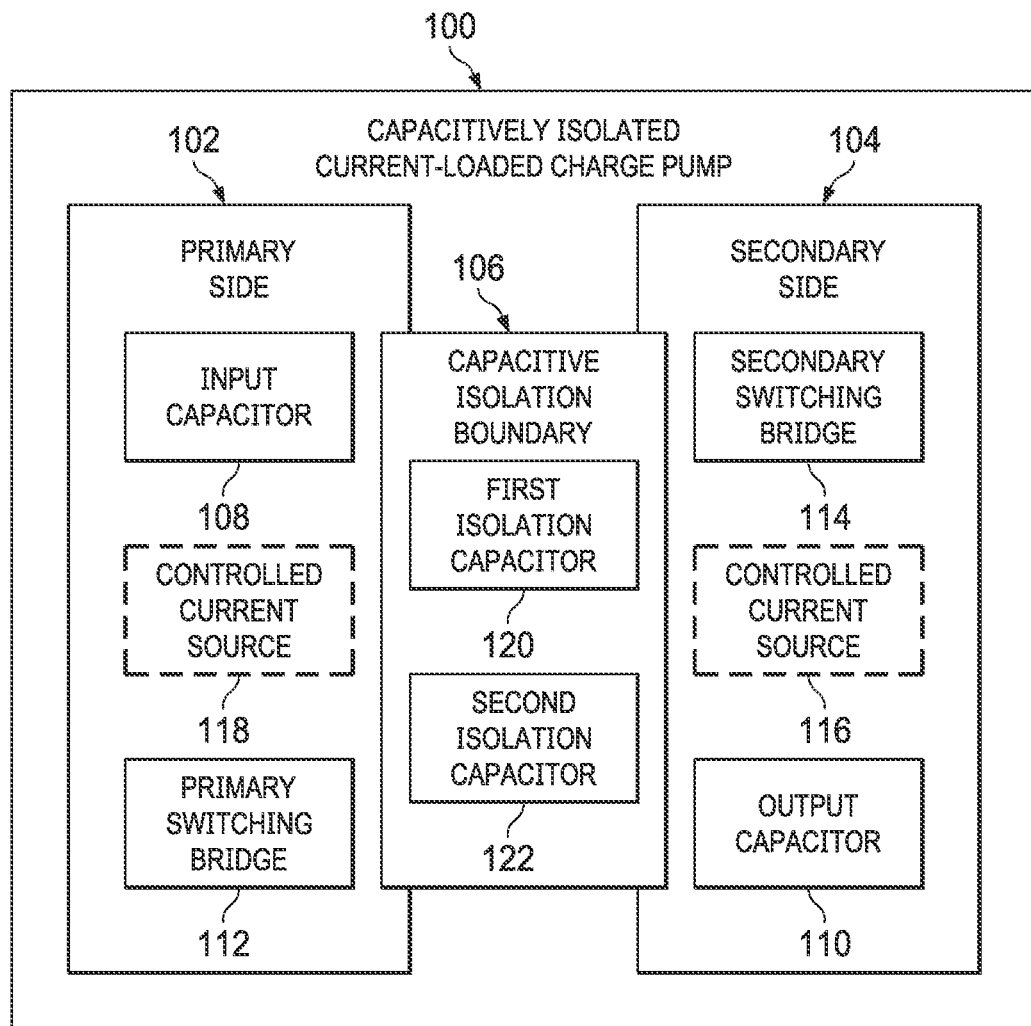
FIG. 1 is a high-level block diagram of an example capacitively isolated current-loaded charge pump.

FIG. 1 illustrates an example capacitively isolated current-loaded charge pump 100 configured to transfer electrical energy from a primary side 102 to a secondary side 104 over a capacitive isolation boundary 106. The primary side 102 and the secondary side 104 have different respective ground terminals. The primary side 102 includes an input capacitor 108 and the secondary side includes an output capacitor 110. As an example, the input capacitor 108 can be coupled at a first end to a primary upper terminal and at a second end to the primary ground terminal on the primary side. The output capacitor 110 can be coupled at a first end to a secondary upper terminal and at a second end to a secondary ground terminal on the secondary side.

Primary side 102 can further include a primary switching bridge 112, and the secondary side 104 can further include a secondary switching bridge 114. Each of the bridges can include a number of switches that can each be implemented, for example, as individual transistors. Capacitive isolation boundary 106 can include a first isolation capacitor 116 and a second isolation capacitor 118 by which the primary and secondary sides are coupled. Charge pump 100 can further include at least one of a secondary-side controlled current source 116 and/or a primary-side controlled current source 118. Where the secondary-side controlled current source 116 is present, it can be coupled between the secondary switching bridge 114 and the output capacitor 110 and configured to maintain an output voltage across the output capacitor 110 and to maintain current through the first isolation capacitor 116 as a square wave. Where the primary-side controlled current source 118 is present, it can be coupled between the primary switching bridge 112 and the input capacitor 108 and configured to maintain an primary-side voltage across the primary switching bridge 112 and to maintain current through the first isolation capacitor 116 as a square wave. The primary and secondary switching bridges 112, 114 can be configured to coordinately switch to transfer electrical energy from the primary side 102 to the secondary side 104.

Figure 2:
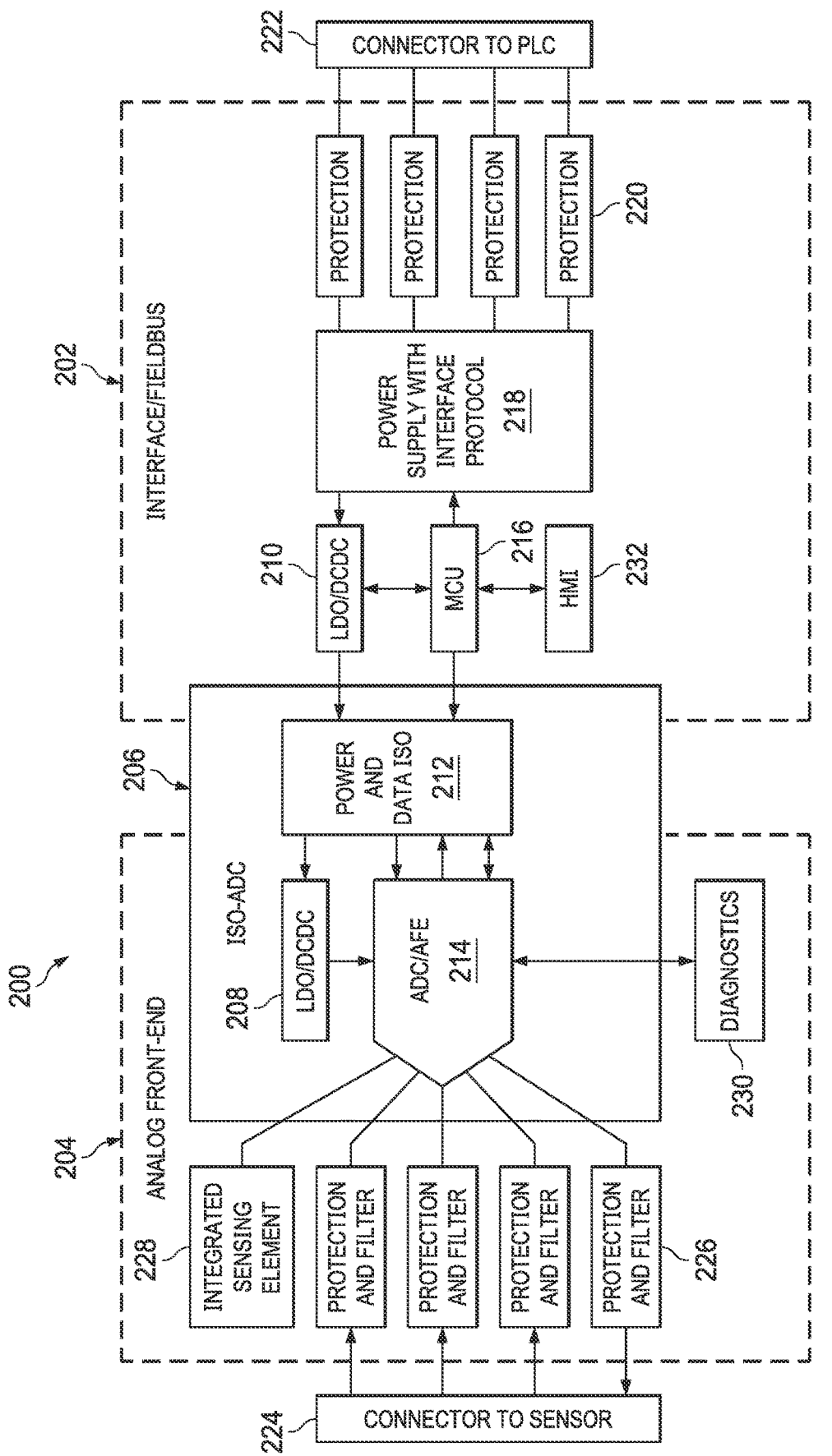
FIG. 2 is a block diagram of an example sensor transmitter including an analog front-end and an interface connected by an isolation barrier with an ADC.

FIG. 2 illustrates an example sensor transmitter 200 having an interface or fieldbus 202 that supplies power to an analog front-end 204 that includes an isolated power supply 206 capable of working in combination with two low drop-out (LDO) regulator and/or DC-to-DC converter components 208, 210 to transfer power across an isolation barrier 212, so as to power an ADC 214 and/or other power-consuming sensor-side components. Sensor transmitter 200 can be used to prepare an analog sensor signal for digital transmission over a line or via wireless transmission to another component, such as a controller. As examples, sensor transmitter 200 can be configured as a pressure transmitter, a flow transmitter, a displacement transmitter, a level transmitter, or a valve state transmitter.

When an external sensor (not shown) is coupled to connector 224, analog signals from the sensor can be passed through one or more protection and filter components 226 and can be digitized by ADC or analog front-end (AFE) component 214. Additionally or alternatively, the transmitter 200 can include an integrated sensing element 228, analog signals from which may likewise be digitized by the ADC/AFE 214. As examples, sensor transmitter 200 can further include a microcontroller unit (MCU) 216 configured to coordinate power and data transfer, a power supply with interface protocol component 218, one or more protection components 220, a connector 222 to a higher-level control device such as a PLC, diagnostics component 230, and a human-machine interface (HMI) component 323. Interface protocols for which sensor transmitter 200 can be configured to use for transmission include a 4-20 mA analog instrumentation current loop protocol; a highway addressable remote transducer (HART) communications protocol, a 0-10 V voltage transmission protocol, a standard input/output (SIO) protocol over an NPN or PNP discrete transistor output, an IO-Link (IEC 61131-9) protocol, or some combination of these.

Figure 3:
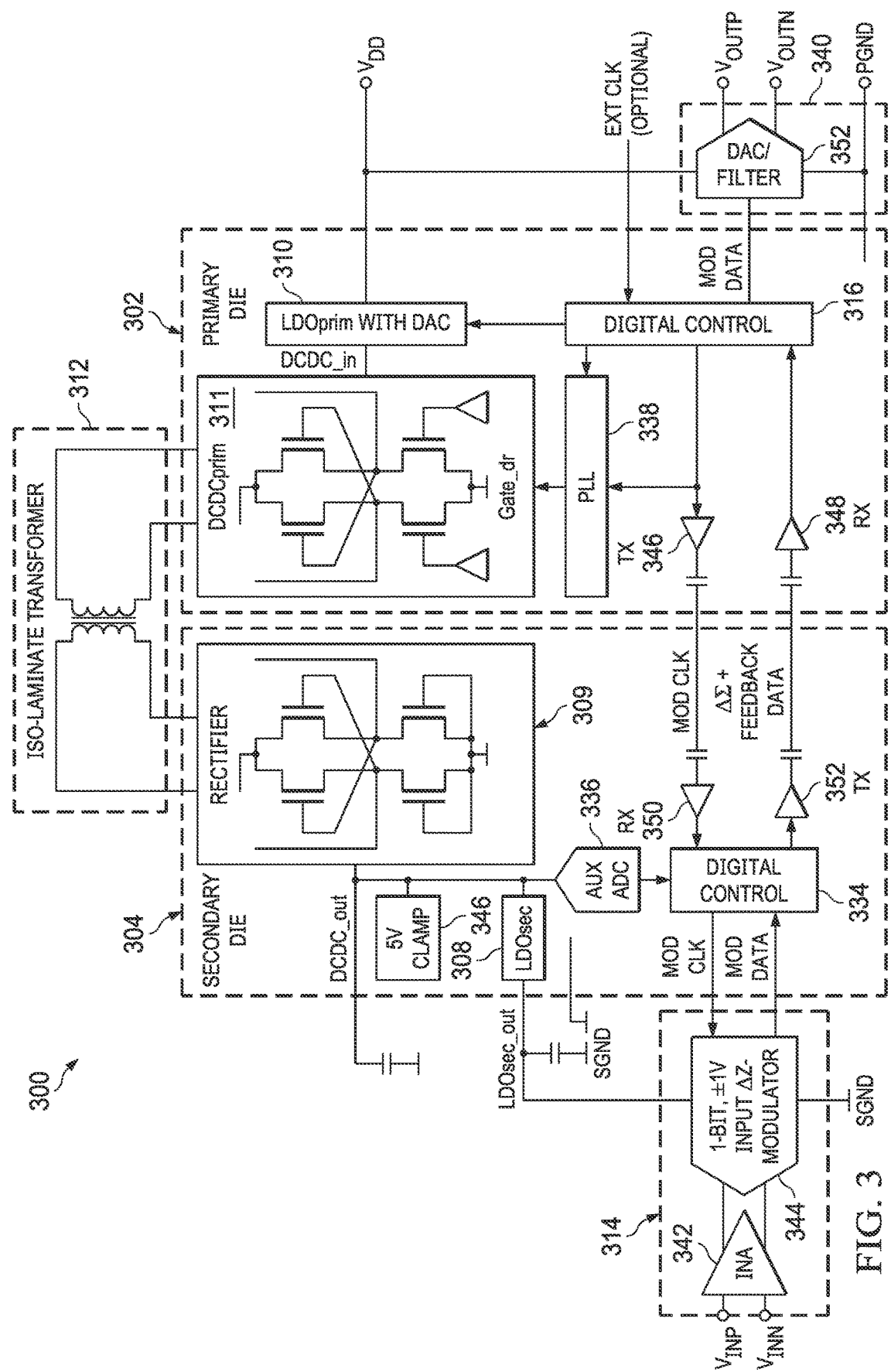
FIG. 3 is a block diagram of an example laminate-transformer-based cross-isolation-barrier DC-to-DC power supply.

FIG. 3 illustrates an example laminate-transformer-based implementation 300 of a cross-isolation-barrier DC-to-DC power supply to an ADC die 314, as may be used in sensor transmitter 200. Primary-side switching is provided by a DC-to-DC converter 311 in primary die 302. Secondary-side switching is provided by rectifier 309 in secondary die 304. A laminate transformer 312 bridges and provides electrical isolation between the primary die 302 and the secondary die 304.

Primary die 302 can further include LDO with digital-to-analog converter (DAC) component 310, phase-locked loop (PLL) component 344, digital control component 316, a transmitter component 346 configured to transmit a modulation clock signal to the secondary die 304, and a receiver component 348 configured to receive delta-sigma modulator and feedback data from the secondary die 304. Secondary die 304 can further include LDO 308, five-volt clamp 346, auxiliary ADC 336, digital control component 334, a receiver component 350 configured to receive the modulation clock signal from the primary die 302, and a transmitter component configured to transmit the delta-sigma modulator and feedback data from the primary die 302. As examples, ADC 314 can include instrumentation amplifier (INA) 342 and delta-sigma modulator 344. The illustrated implementation 300 can further include DAC/filter die 340 containing DAC/filter component 352 configured to provide an output signal representative of the analog input signal provided to the ADC 314.

Figure 4:
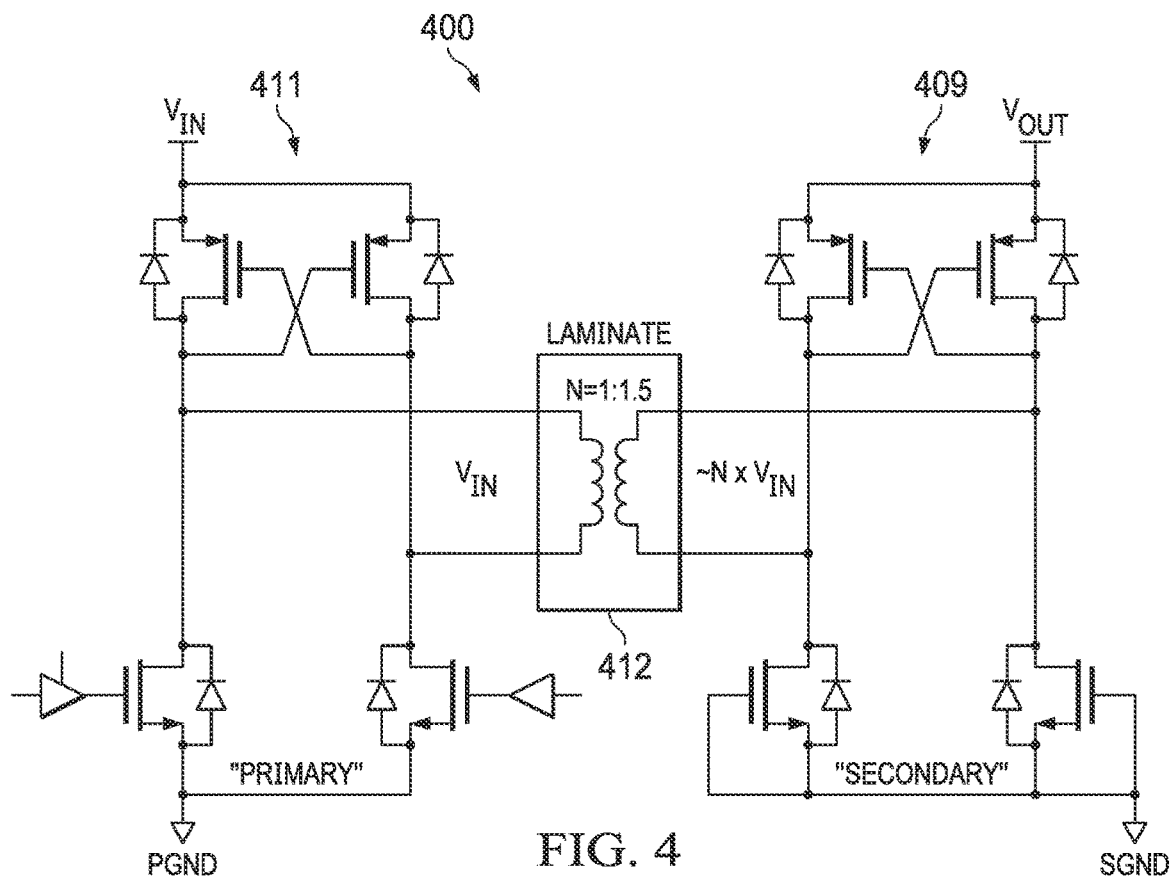
FIG. 4 is a switching circuit diagram of an example quasi-resonant cross-isolation-barrier DC-to-DC power supply using a laminate transformer to provide isolation.

FIG. 4 shows a switching circuit diagram for an example quasi-resonant cross-isolation-barrier DC-to-DC power supply 400 using a laminate transformer 412 to provide isolation, as may be used in the implementation 300 of FIG. 3. In contrast to FIGS. 2 and 3, in FIG. 4, primary switching circuitry 411, corresponding to primary DC-to-DC converter 311 of FIG. 3, is shown on the left of FIG. 4, and secondary switching circuitry 409, corresponding to rectifier 309 of FIG. 3, is shown on the right of FIG. 4, meaning that power transfer is directed from left to right in FIG. 4. In the illustrated example of FIG. 4, transformer 412 has voltage ratio N=1:1.5, such that the output voltage $V_{OUT}$ is approximately $N \times V_{IN}$.

Figure 5:
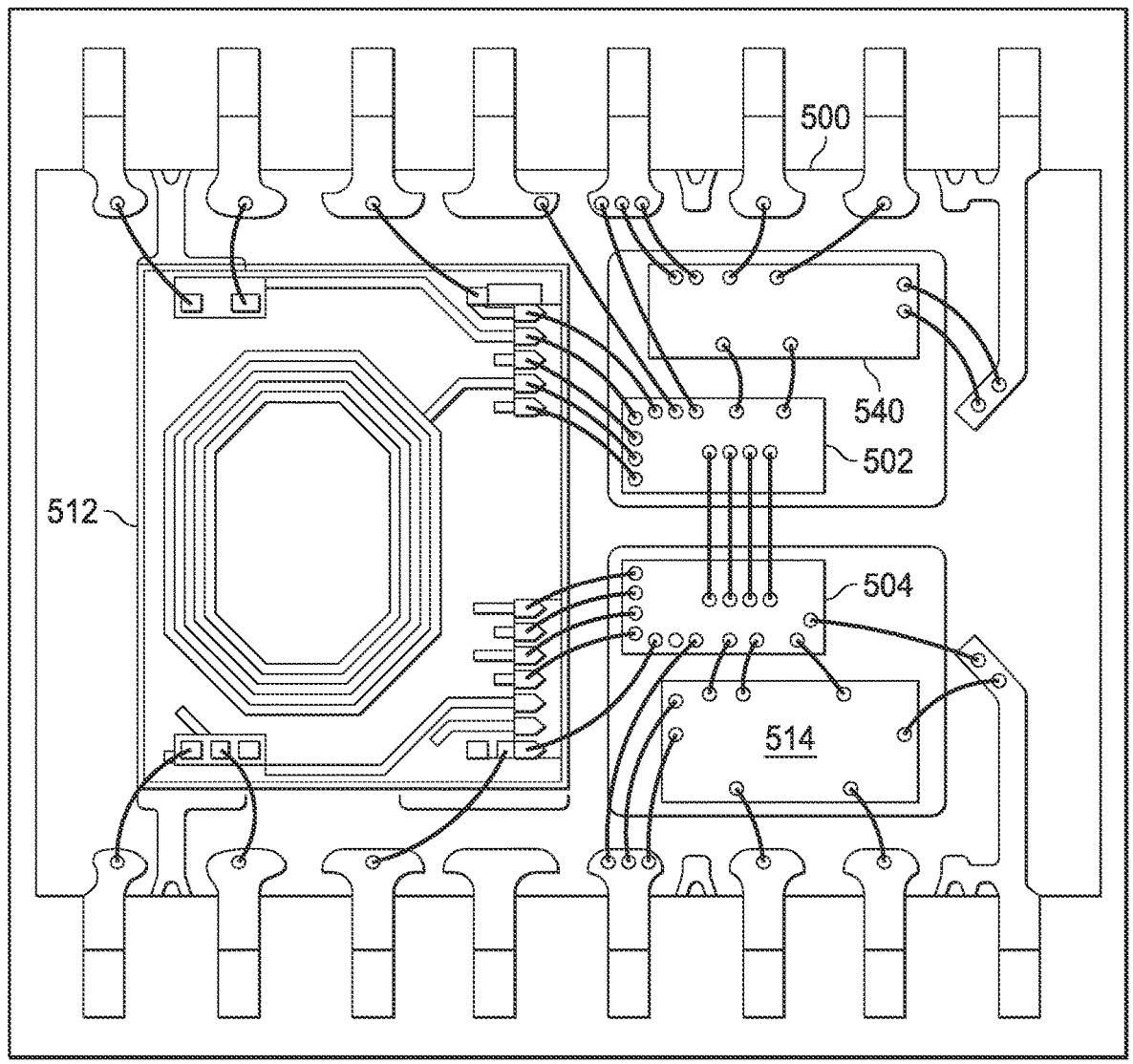
FIG. 5 is a cutaway illustration of an example device package of a laminate-transformer-based cross-isolation-barrier DC-to-DC power supply to an ADC.

FIG. 5 shows an example device package 500 of a laminate-transformer-based cross-isolation-barrier DC-to-DC power supply to an ADC, integrating dies of the different components and laminate transformer 512, which can correspond to transformer 312 and transformer 412 of FIGS. 3 and 4, respectively. On-chip power transformer 512 can have its primary and secondary windings separated by a thin-film polymer as the insulating material. Example dimensions of package 500 are 7.5 mm width (the dimension between the two rows of pins) by 10.3 mm length (the dimension along either row of pins) by 2.6 mm height (the thickness dimension of the package). Primary die 502 can correspond to primary die 302 of FIG. 3. Secondary die 504 can correspond to secondary die 304 of FIG. 3. ADC die 514 can include an INA with a delta-sigma modulator and can correspond to ADC die 314 of FIG. 3. DAC/filter die 540 can correspond to DAC/filter die 340 of FIG. 3. In other examples (not illustrated), all of the components may be fabricated together on the same die.

The on-chip transformer-based power transfer circuitry of FIGS. 3-5 can provide power transfer efficiency of between approximately 50 and 60 percent when supplying low power (for example, tens of mW), which may be adequate for many applications, but may be considered too low for others. This circuitry also has a disadvantage of being relatively high cost for low-power applications, as where, for example, it may be desired to transfer only between about 10 mW and about 20 mW of power from the primary side to the secondary side. For example, fabrication cost of the transformer can be in excess of one U.S. dollar. The transformer-based power transfer circuitry of FIGS. 3-5 has the further disadvantage of layout constraints due to laminate co-packaging, which prevents a product designer making use of the package from arranging the circuitry and the transformer in a different arrangement in a product design. The transformer-based power transfer circuitry of FIGS. 3-5 has the further disadvantage of having relatively high radiated EMI.

Figure 6:
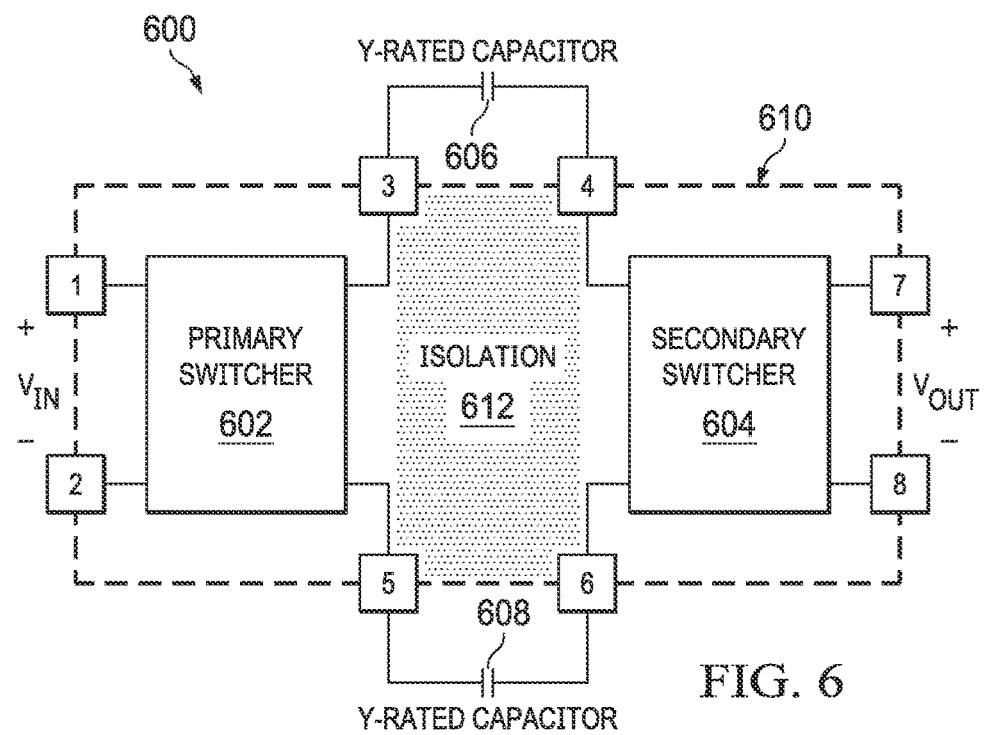
FIG. 6 is a block diagram of an example capacitive isolation architecture for power transfer between a primary side and a secondary side across an isolation barrier.

FIG. 6 provides a capacitive isolation architecture 600 for power transfer between a primary side on the left having primary switcher 602 and a secondary side on the right having secondary switcher 604, which can be provided in a single chip or package 610. Isolation between primary and secondary sides can be provided on-chip by isolation barrier 612 while power transfer across sides can be provided off-chip by capacitors 606, 608. Capacitors 606, 608 can be, for example, Y-rated capacitors, which can provide desired isolation features in that they fail open and have relatively high breakdown voltages. As examples, Y2-rated capacitors provide basic isolation at impulses of up to 5 kV, and Y1-rated capacitors provide reinforced isolation at impulses of up to 8 kV. As common-mode transient immunity is not a concern in an isolated-ADC application, capacitive isolation can be provided using capacitors having capacitances of greater than 1 nF. As an example, a 1.5 nF Y2-rated capacitor can be of dimensions 4.5 mm×2 mm×1.5 mm.

As with the transformer-based isolation boundary of the integrated package 500 of FIG. 5, the capacitive-based isolation boundary of architecture 600 can be configured to survive kilovolt-level voltages applied across it without dielectric breakdown, and, in the event of failure, the isolation boundary element will fail open, rather than failing short, increasing device safety. Architecture 600 can also provide increased component placement configuration flexibility as compared to the integrated package 500 of FIG. 5, because the capacitors 606, 608 can be provided off-chip and arranged in different ways in relation to chip or package 610. Also, architecture 600 can be provided at lower cost (e.g., at between about 3 and about 4 U.S. cents for through-hole capacitors, or at between about 10 and about 20 U.S. cents for surface-mount capacitors) for low-power (e.g., 10-20 mW) applications. As described in greater detail with regard to FIGS. 12 and 14, architecture 600 can also provide reduced EMI as compared to transformer-based power transfer architectures like that of FIGS. 3-5. Still further, architecture 600 can provide comparable or higher power transfer efficiency as compared to transformer-based power transfer architectures such as that of FIGS. 3-5.

Figure 7A:
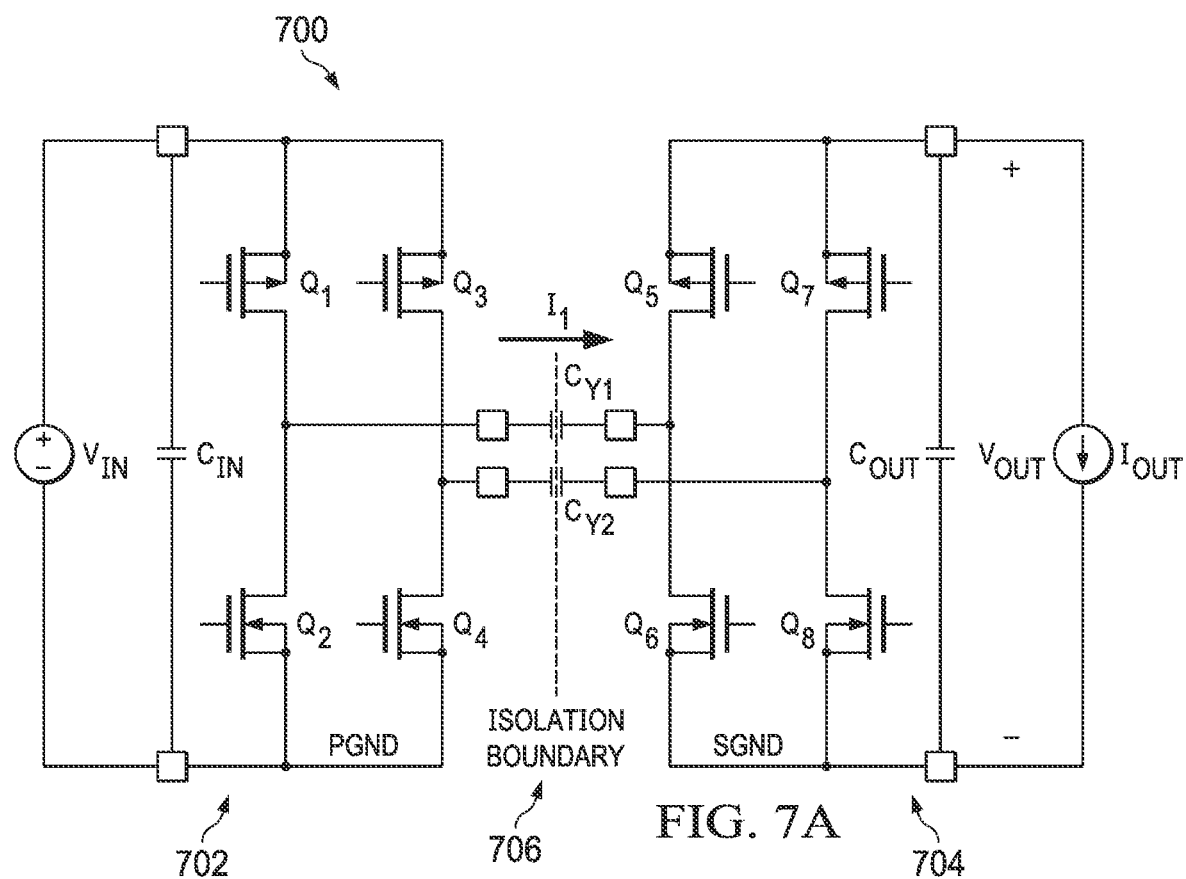
FIG. 7A is a circuit diagram of an example capacitively isolated charge pump circuit configured as a DC-to-DC converter.

FIG. 7A illustrates an example capacitively isolated charge pump circuit 700 configured as a DC-to-DC converter having a capacitor barrier 706 including capacitors $C_{Y1}$ and $C_{Y2}$ in the middle of primary side 702 and secondary side 704. Capacitors $C_{Y1}$ and $C_{Y2}$ can, for example, be Y-rated capacitors. A source of electrical energy is provided on the primary side 702, as represented by voltage source $V_{IN}$ across input capacitor CIN. Eight field effect transistors (FETs) $Q_1$-$Q_8$ are each configured to act as a switch, controllably permitting or cutting off the flow of source-drain current. The gate of each FET can be coupled to control circuitry for this control purpose. Although this control circuitry has been omitted from FIG. 7A for purposes of simplicity, the control circuitry can be provided, for example, as microcontroller 216 shown in FIG. 2. FETs $Q_1$-$Q_4$ form a primary-side bridge and FETs $Q_5$-$Q_8$ form a secondary-side bridge.

Charge pump circuit 700 of FIG. 7A can be controlled to switch with an operation period T, with primary and secondary bridges switching in synchrony with an about 50 percent duty cycle. A single such operation period T is shown in each of the graphs of FIGS. 7B and 7C. In an example full-bridge operation, in the first half of the operation period (T/2), charge pump circuit 700 closes the switches of FETs $Q_1$ and $Q_4$ and opens the switches of $Q_2$ and $Q_3$ on the primary side 702 and contemporaneously closes switches of FETs $Q_5$ and $Q_8$ and opens the switches of FETs $Q_6$ and $Q_7$ on the secondary side 704, in each case permitting current flow through only the closed switches. A first impulse 708 of current $I_1$ through capacitor $C_{Y1}$ is thus created, and a corresponding amount of charge is pushed from the primary side 702 to the secondary side 704 through capacitor $C_{Y1}$. During this first half-period, then, current flows from left to right through FET $Q_1$, through capacitor $C_{Y1}$, through FET $Q_5$, passes through capacitor $C_{OUT}$ and the load represented by the current source symbol labeled $I_{OUT}$, comes through secondary ground terminal SGND, flows back through FET $Q_8$, and then flows back through capacitor $C_{Y2}$, and finally through FET $Q_4$ to the primary ground terminal PGND. Charge is thus returned through capacitor $C_{Y2}$ in the opposite direction as it came from $C_{Y1}$.

In the second half of the period in the example full-bridge operation, the switches of FETs $Q_2$ and $Q_3$ on the primary side 702 and the switches of FETs $Q_6$ and $Q_7$ on the primary side 704 are closed, permitting current flow therethrough, and the other switches are opened. A second impulse 710 of current of current $I_1$ through capacitor $C_{Y1}$ is thus created, opposite in sign from the first impulse. Accordingly, during this second half-period, charge is injected through capacitor $C_{Y2}$ in the positive direction, from left to right of FIG. 7A, and returns back through capacitor $C_{Y1}$. In both halves of the period, power is transferred from the primary side 702 to the secondary side 704, sustaining a voltage potential difference $V_{OUT}$ across output capacitor $C_{OUT}$ at the output. As examples, $V_{IN}$ can be provided as between about 3.3 V and about 5 V, and $V_{OUT}$ can be accordingly provided as approximately the same value as $V_{IN}$ when the secondary side 704 is operated in a full-bridge mode or as approximately twice the value of $V_{IN}$ when secondary side 704 is operated in a half-bridge mode. In each case $V_{OUT}$ may be slightly less than the expected value of $V_{IN}$ or $2V_{IN}$ considering non-idealities. Maximum output current $I_{OUT}$ may be, for example, approximately 3 mA.

The bridge of secondary side 704 may be operated in a half-bridge mode to increase the output voltage $V_{OUT}$, e.g., to approximately $2V_{IN}$. This is in contrast to full-bridge mode operation of secondary side 704, in which there is approximately a 1:1 conversion from input to output, that is, from $V_{IN}$ to $V_{OUT}$. In half-bridge operation, the switch of FET $Q_8$ is closed for both halves of operation period T, the switch of FET $Q_7$ is opened for both halves of operation period T, and only the switches of FETs $Q_5$ and $Q_6$ are permitted to switch, in the same fashion as described above with respect to full-bridge mode, such that $Q_5$ is closed and $Q_6$ is opened during the first half-period of operation, and $Q_5$ is opened and $Q_6$ is closed during the second half-period of operation. During the first half-period, current flows in secondary side 704 through capacitor $C_{Y1}$, FET $Q_5$, the load, FET $Q_8$, and out through capacitor $C_{Y2}$. During the second half-period, current flows in secondary side 704 through capacitor $C_{Y2}$, FET $Q_8$, FET $Q_6$, and out through capacitor $C_{Y1}$. By thus operating the secondary side 704 in half-bridge mode, a voltage-doubling effect can be created, in cases where a boost to the output voltage is desired. Circuit 700 may in some examples be configured to be dynamically switched between secondary-side full-bridge mode and secondary-side half-bridge mode (output voltage doubling mode) via control circuitry to which switches represented by FETs $Q_7$ and $Q_8$ are connected by their gates. The same functionality can be provided to the charge pump circuits 800, 900, 1000, and 1100 of FIGS. 8A, 9, 10, and 11.

Figure 7B:
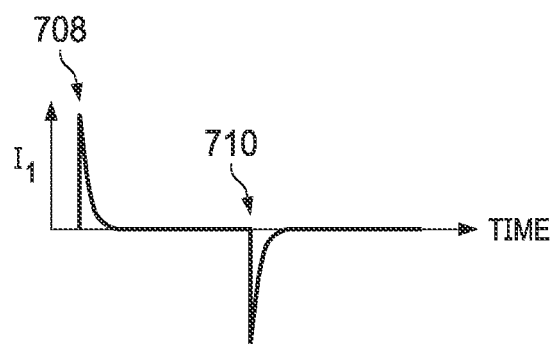
FIG. 7B is a graph of an example current through an isolation capacitor in the charge pump circuit of FIG. 7A.
Figure 7C:
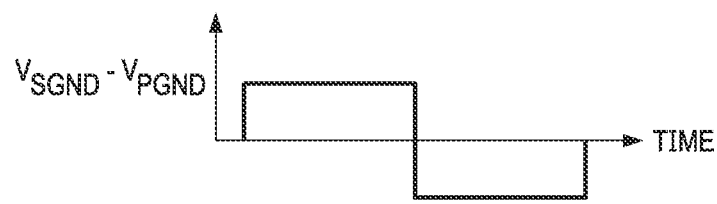
FIG. 7C is a graph of an example secondary ground terminal voltage in the charge pump circuit of FIG. 7A.

FIG. 7B is a graph of current $I_1$ through capacitor $C_{Y1}$ from the primary side 702 to the secondary side 704 as a function of time over a single operation period T. The graph appears as two approximately equal and opposite decaying impulses 708, 710, the decay in each case corresponding to the charging and discharging of capacitor $C_{Y1}$. FIG. 7C is a corresponding graph of voltage $V_{SGND}$ at the secondary ground terminal SGND with respect to voltage $V_{PGND}$ at the primary ground terminal PGND as a function of time over a single operation period T. As shown in FIG. 7C, this comparative ground voltage takes the form of a square wave for charge pump circuit 700.

Output voltage $V_{OUT}$ can be adjusted by varying the frequency operation of converter 700. To achieve regulation, converter 700 may need to operate in slow-switching limit. If the input voltage $V_{IN}$ varies widely, in order to maintain a constant output voltage $V_{OUT}$, the switching frequency may need to be varied across a wide range of switching frequencies, e.g., including frequencies between about 1 MHz and 1,000 MHz. In converter 700, the isolation capacitors $C_{Y1}$, $C_{Y2}$ are hard charged, with the result that these capacitors may experience high peak currents that can be, for example, greater ten times output current $I_{OUT}$, contributing to energy losses. For example, even if the switches are lossless, half the energy supplied to the capacitor can be lost with each charge. Furthermore, high EMI is generated when charge is transferred to the output with a mismatch between the capacitors $C_{Y1}$ and $C_{Y2}$. The generated EMI can be a combination of conducted and radiated EMI. Conducted EMI results as follows. During switching of the charge pump 700, there is a net voltage swing on the secondary ground terminal SGND with respect to the primary ground terminal PGND, as shown in FIG. 7C. This square wave movement of voltage on the secondary ground terminal SGND with respect to the primary ground terminal PGND can cause currents to flow through an impedance between the secondary ground terminal SGND and the primary ground terminal PGND that can be based, for example, on parasitic effects, which currents can then manifest as conducted EMI on the primary side 702 of the isolation boundary 706. Additionally, because of the voltage swing between the secondary ground terminal SGND and the primary ground terminal PGND, converter 700 acts like a dipole, and if the secondary ground and primary ground planes are large enough, converter 700 can act like an antenna, radiating EMI.

Figure 8A:
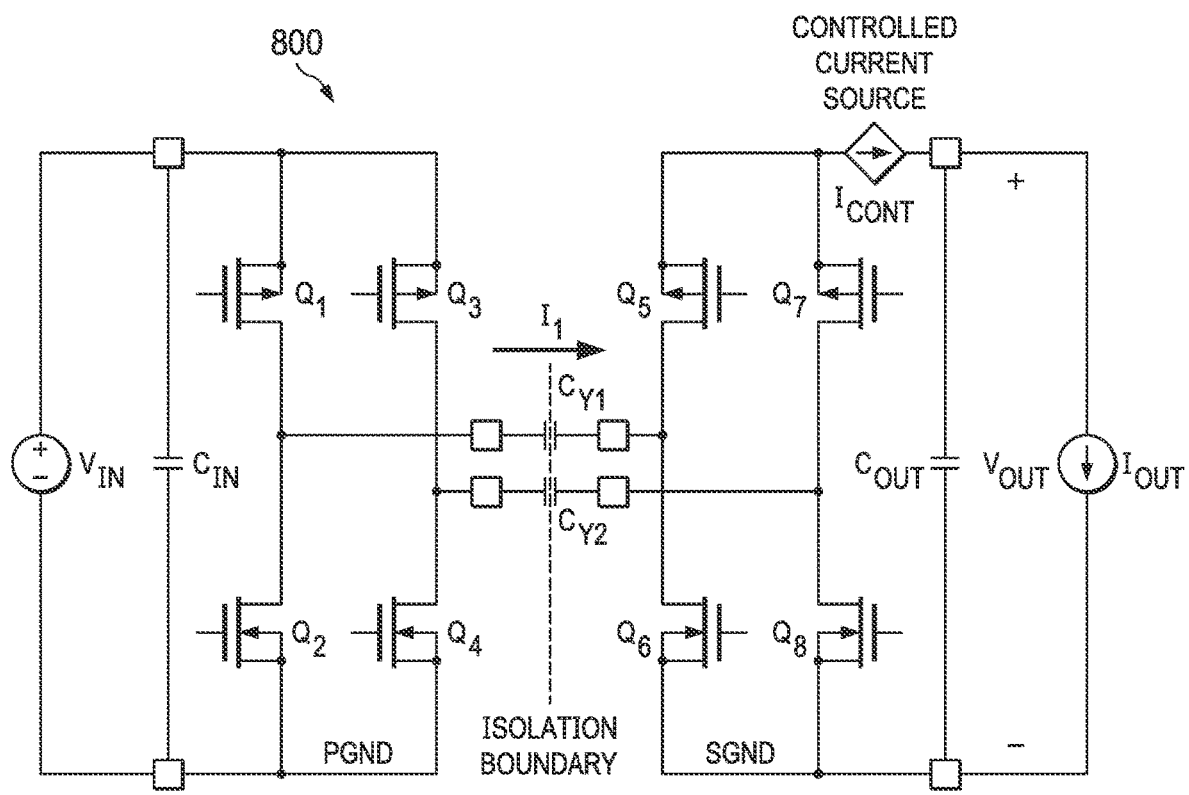
FIG. 8A is a circuit diagram of an example capacitively isolated current-loaded charge pump circuit configured as a DC-to-DC converter.

FIG. 8A shows an example capacitively isolated current-loaded charge pump circuit 800 that reduces the voltage swings on secondary ground to greatly reduce EMI as compared to EMI generated by converter 700 of FIG. 7. The operation of switches provided as FETs $Q_1$-$Q_8$ can be the same as described above with respect to the functioning of converter 700, with primary and secondary bridges switching in synchrony at a 50 percent duty cycle. However, instead of operating over a range of frequencies, charge pump 800 can be operated with fixed-frequency operation, with output voltage regulation provided by controlled current source $I_{CONT}$. Also, instead of doing impulse charging of the isolation capacitors as shown in the circuit 700 of FIG. 7A, in charge pump 800 shown in FIG. 8A, the isolation capacitors $C_{Y1}$, $C_{Y2}$ are charged and discharged the using controlled current provided by the controlled current source $I_{CONT}$.

Figure 8B:
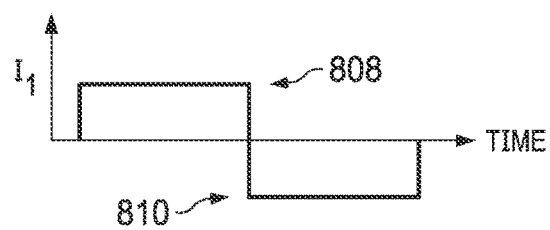
FIG. 8B is a graph of an example current through an isolation capacitor in the charge pump circuit of FIG. 8A.
Figure 8C:
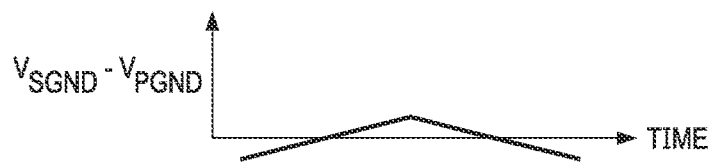
FIG. 8C is a graph of an example secondary ground terminal voltage in the charge pump circuit of FIG. 8A.

In charge pump 800 of FIG. 8A, controlled current source $I_{CONT}$ is provided on the secondary (output) side is used to transfer power. In the first half of the switching period T, a nearly constant positive current flows through isolation capacitor $C_{Y1}$ from left to right, that is, from the primary side to the secondary side, and returns to the primary side through isolation capacitor $C_{Y2}$. In the second half of the switching period T, a nearly constant positive current flows through isolation capacitor $C_{Y2}$ from left to right, that is, from the primary side to the secondary side, and returns to the primary side through isolation capacitor $C_{Y1}$. Instead of impulse currents 708, 710 as shown in FIG. 7B, nearly constant currents flow through $C_{Y1}$ and $C_{Y2}$, as shown in FIG. 8B. The elimination of impulse currents 708, 710 in the operation of circuit 800, which is an example of soft-charging, means that the voltage swing on secondary ground terminal SGND no longer takes the form of a square wave, as shown in FIG. 7C, but instead takes the form of a triangle wave, as shown in FIG. 8C. As compared to the square wave, the harmonics of a triangle voltage waveform fall off faster. Whereas the harmonics of a square wave fall off at a rate of $1/n$, n being the harmonic number, the case of triangle wave, the harmonics fall off at a rate of $1/n^2$. Thus, the frequency spurs present in the secondary ground voltage $V_{SGND}$ of circuit 800 at higher charge pump switching frequencies are smaller than they would be in circuit 700, which has the effect of reducing generated EMI, both conducted and radiated. EMI can be further reduced in operation of circuit 800 as compared to circuit 700 inasmuch as circuit 800 can be operated as a greatly reduced constant switching frequency as compared to some of the higher switching frequencies over which circuit 700 may need to be operated to maintain a desired output voltage. For example, circuit 800 can be operated at a constant switching frequency less than about 60 MHz, less than about 50 MHz, e.g., less than about 10 MHz, e.g., less than about 5 MHz, e.g., about 1 MHz or less. For example, the operation period T can be constant and between about 20 nanoseconds and about 10 microseconds, e.g., between about 100 nanoseconds and about 5 microseconds, e.g., about 1 microsecond.

As an example, circuit 800 can be operated to have a charging current $I_1$ equal to the output current $I_{OUT}$ in full-bridge mode or $2I_{OUT}$ in half-bridge mode, as compared having an impulse current that is, for example, five or ten times higher than the output current $I_{OUT}$, as in the operation of circuit 700. Such operation has the further benefit of reducing current stresses on the capacitors and switches, meaning that the devices can potentially be made smaller than in circuit 700.

Figure 9:
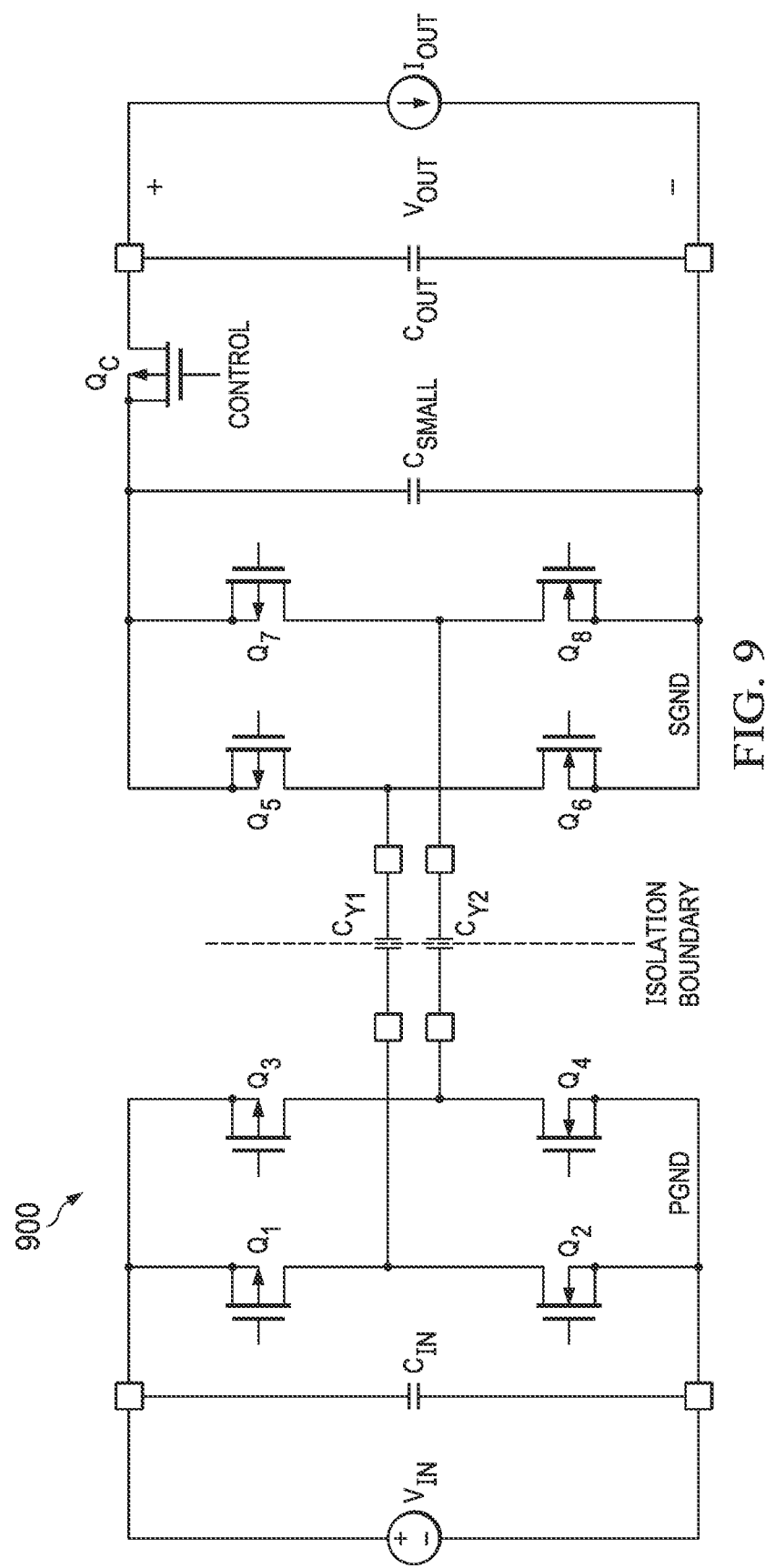
FIG. 9 is a circuit diagram of an example implementation of the capacitively isolated current-loaded charge pump circuit of FIG. 8A.

FIG. 9 illustrates an example implementation 900 of the capacitively isolated current-loaded charge pump 800 of FIG. 8 that can use a gate-controlled FET, e.g., a metal-oxide-semiconductor FET (MOSFET), as a pass transistor $Q_C$ on the secondary (output) side to provide current-source loading of the charge pump 900. The gate of the pass transistor $Q_C$ can be controlled to regulate the amount of current that flows through the pass transistor $Q_C$ from source to drain. In some examples, an on-chip decoupling capacitor $C_{small}$ can be provided on the secondary (output) side of the converter 900, coupled between the source of the pass transistor $Q_C$ and the secondary ground terminal SGND, to ensure regulation. The capacitance value of decoupling capacitor $C_{small}$ can, for example, be less than about one tenth the capacitance value of output capacitor $C_{OUT}$, e.g., between about one hundredth the capacitance value of output capacitor $C_{OUT}$ and about one tenth the capacitance value of output capacitor $C_{OUT}$. The gate-source voltage VGS of the pass transistor $Q_C$ may be kept constant so that pass transistor $Q_C$ is able to pull a constant current. If the capacitance value of decoupling capacitor $C_{small}$ is too small, voltage across it may swing too much, which may result in failure to regulate the gate-source voltage VGS of the pass transistor $Q_C$.

In converter 800 and its example implementation 900, regulation is on the secondary side, meaning that no communication is required across the isolation barrier. The example current-loaded charge pumps 800, 900 of FIGS. 8 and 9 have the further advantage that they can achieve greater than about 80 percent efficiency at an about 1:1 conversion with small dropout.

The gate of the pass transistor $Q_C$ can be coupled to transistor-based control circuitry (not shown in FIG. 9) configured to control drain-source current flow and thus current flow through capacitors $C_{Y1}$ and $C_{Y2}$. The control circuitry can be configured to sense the output voltage $V_{OUT}$, compare it to a reference voltage (or a set of reference voltages specifying a tolerance range), and based on that comparison, will either increase or decrease the gate-source voltage of the pass transistor $Q_C$. For example, if the output voltage $V_{OUT}$ is too high compared to the reference voltage (or a high reference voltage), then the control circuitry will reduce the gate-source bias of the pass transistor $Q_C$ so that its drain-source current is reduced and the output voltage $V_{OUT}$ is lowered. By contrast, if, for example, the output voltage $V_{OUT}$ is too low compared to the reference voltage (or a low reference voltage), then the control circuitry will increase the gate-source bias of the pass transistor $Q_C$ so that its drain-source current is increased and the output voltage $V_{OUT}$ is raised. For example, if design parameters specify that an output voltage $V_{OUT}$ is to be maintained at 3.3 V, and the output voltage $V_{OUT}$ is permitted to vary by plus or minus 10 percent, control circuitry can be configured either to maintain the output voltage $V_{OUT}$ as close to 3.3 V as possible, or to maintain the output voltage $V_{OUT}$ above 2.97 V and below 3.63 V. Although the control circuitry is not shown in FIG. 9, the control circuitry can be provided, for example, as microcontroller 216 shown in FIG. 2.

Figure 10:
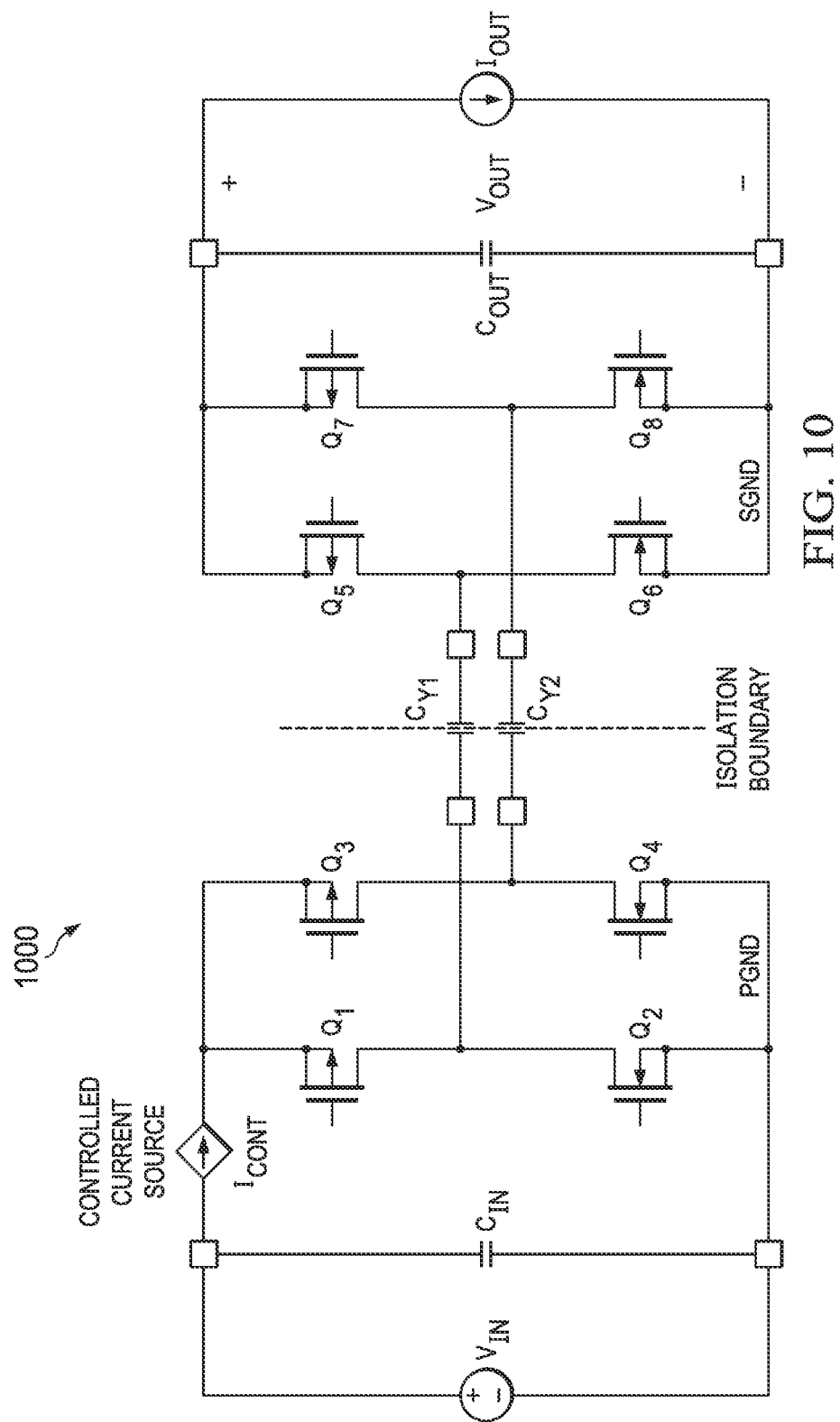
FIG. 10 is a circuit diagram of another example capacitively isolated current-driven charge pump circuit configured as a DC-to-DC converter.

FIG. 10 illustrates another example capacitively isolated current-driven charge pump 1000, similar to charge pump 800 of FIG. 8, but with the controlled current source $I_{CONT}$ on the primary (input) side rather than on the secondary (output) side. Charge pump 1000 can be operated similarly to charge pump 800, with half-bridge or full-bridge switching and fixed-frequency operation, and can provide the same soft-charging, low-peak-current, low-EMI advantages of charge pump 800, but instead of controlling the output current on the secondary side, as in charge pump 800, in charge pump 1000, controlled current source $I_{CONT}$ controls the input current on the primary side of the converter.

Figure 11:
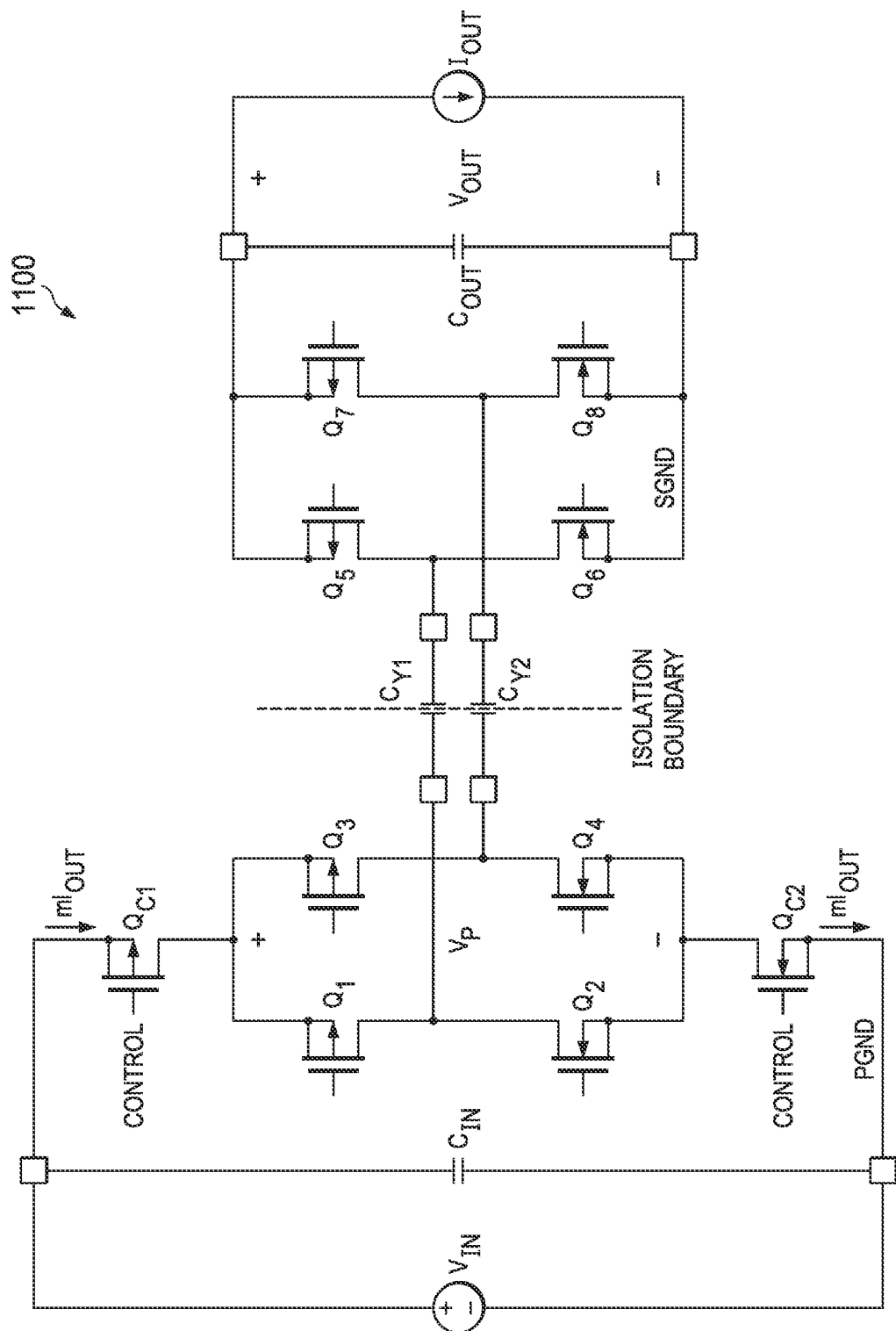
FIG. 11 is a circuit diagram of an example implementation of the capacitively isolated current-driven charge pump circuit of FIG. 10.

FIG. 11 illustrates an example implementation 1100 of the capacitively isolated current-loaded charge pump 1000 of FIG. 10 in which the current source $I_{CONT}$ is of a symmetric design so that the voltage swing on the secondary ground terminal is reduced, and uses two gate-controlled FETs (e.g., MOSFETs) $Q_{C1}$, $Q_{C2}$ to simultaneously control the currents to the top and bottom of the primary-side bridge and thereby to provide current-source drive for charge pump 1100. The symmetry of the gate-controlled FET arrangement minimizes common-mode EMI. An asymmetric configuration results in higher EMI, but better efficiency due to one less FET dropout. To provide the desired control, the gates of FETs $Q_{C1}$, $Q_{C2}$ can be coupled to control circuitry, which for simplicity of illustration is not shown in FIG. 11, but which may correspond to microcontroller 216 shown in FIG. 2.

Instead of directly regulating the voltage at the output $V_{OUT}$, charge pump circuit 1100 can regulate primary voltage VP, as measured from the top to the bottom of the primary-side bridge in FIG. 11, and approximately the same voltage will appear as the output voltage $V_{OUT}$, accounting for whatever efficiency loss there may be in the bridges and the capacitors $C_{Y1}$, $C_{Y2}$. The regulation on primary side of charge pump 1100 provides the advantage that no communication is required across isolation barrier when only coarse regulation is desired. When very fine regulation is desired, signals can be communicated from the secondary side to the primary side across the isolation boundary so that the output voltage $V_{OUT}$ can be directly regulated. As shown in FIG. 11, the control to FETs $Q_{C1}$, $Q_{C2}$ can be regulated to provide current from the top to the bottom of the primary-side bridge that is about equal to $mI_{OUT}$, where m is 1 when the secondary-side bridge is operated in full-bridge mode and m is 2 when the secondary-side bridge is operated in half-bridge mode (voltage-doubling mode). As with example charge pumps 800 and 900, the example current-driven charge pumps 1000, 1100 of FIGS. 10 and 11 can achieve greater than about 80 percent efficiency at an about 1:1 conversion with small dropout.

Figure 12:
FIG. 12 is a frequency graph of example modeled and measured radiated electromagnetic interference of a transformer-isolated converter like that of FIGS. 3-5.
Figure 14:
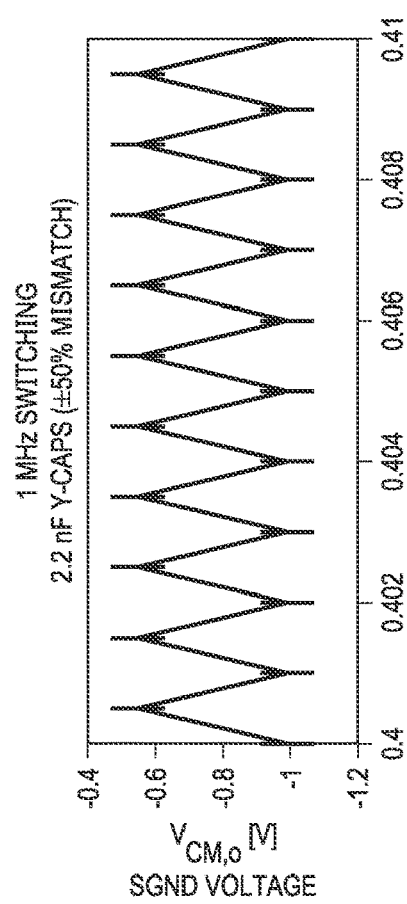
FIG. 14 is a frequency graph of example modeled radiated electromagnetic interference of a capacitively-isolated converter like that of FIG. 8A, 9, 10, or 11.

Each of the example capacitively isolated charge pump circuits 800, 900, 1000, or 1100 can be operated to demonstrate similar cross-barrier current $I_1$ to that shown in FIG. 8B and thus to have a triangular-shaped time variation in secondary ground voltage $V_{SGND}$ with respect to primary-ground voltage $V_{PGND}$ similar to that shown in FIG. 8C. Because the example capacitively isolated charge pump circuits 800, 900, 1000, or 1100 can be configured to operate at lower switching frequencies and can have lower secondary ground voltage swings, they can operate with substantially lower common-mode EMI than produced by the capacitively isolated charge pump 700 of FIG. 7 or the inductively isolated DC-to-DC converter of FIGS. 3-5. FIGS. 12-15 illustrate EMI improvements as compared to a transformer-isolated converter. FIGS. 12 and 14 show common-mode EMI as a function of operating frequency (bridge switching frequency), FIG. 12 for a transformer-isolated converter like that of FIGS. 3-5 and FIG. 14 for a capacitively isolated converter like any of converters 800, 900, 1000, or 1100. In FIG. 14, simulated EMI results generated from a computer model are compared to practical measurements of electromagnetic field at a test distance from the converter, e.g., by setting up a transverse electromagnetic (TEM) cell receiver a few meters away from the converter. FIG. 14 shows simulated results only. In each of the simulated results of FIGS. 12 and 14, the converter is modeled as an antenna that radiates noise, based on knowledge of how much voltage is generated within the respective converter circuits and the impedance of the resultant antenna based on its size. After a differential voltage between primary ground and secondary ground of a converter is known, and along with the respective sizes of the primary and secondary ground planes, the physical characteristics of a corresponding antenna can be modeled as a voltage source and an impedance, from which the amount of radiated EMI at the test distance can be computed.

As shown in FIG. 14 by comparison with FIG. 12, not only is radiated EMI lower for the capacitively isolated current-loaded converter than for the transformer-isolated converter at all frequencies, but EMI is generally lower in the capacitively-isolated converter because the capacitively isolated converter can be operated at constant lower frequency, putting operation on the lower end of the spectrum of FIG. 14. For example, whereas the transformer-based architecture operates at 60 MHz switching, the capacitively isolated current-loaded converter can be configured to operate at about 1 MHz. As an example, as shown in FIG. 14, when circuit 800, 900, 1000, or 1100 is operated at a constant switching frequency of 1 MHz, corresponding to an operation period T of 1000 nanoseconds, the circuit radiates EMI of less than about 10 dBuV/m in the range of 30 MHz to 1 GHz prescribed by EMI standards. Switching at 1 MHz generates higher-frequency harmonics that appear, for example, in the shown 30 MHz to 1 GHz range.

Figure 13:
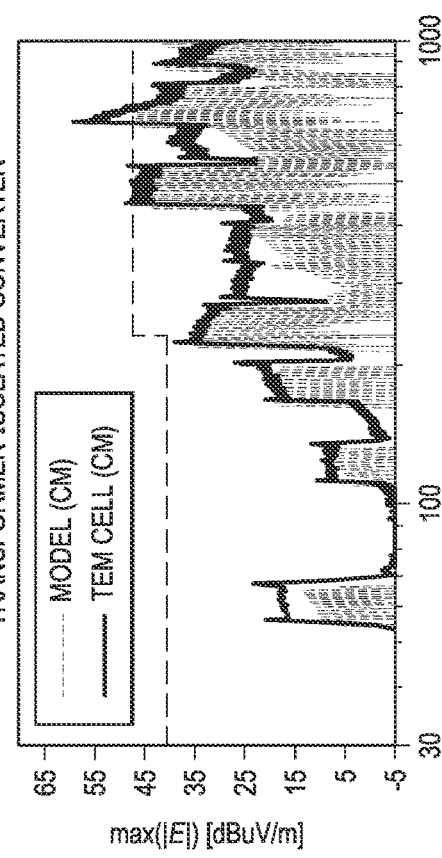
FIG. 13 is a time graph of an example secondary ground voltage of a transformer-isolated converter like that of FIGS. 3-5.
Figure 15:
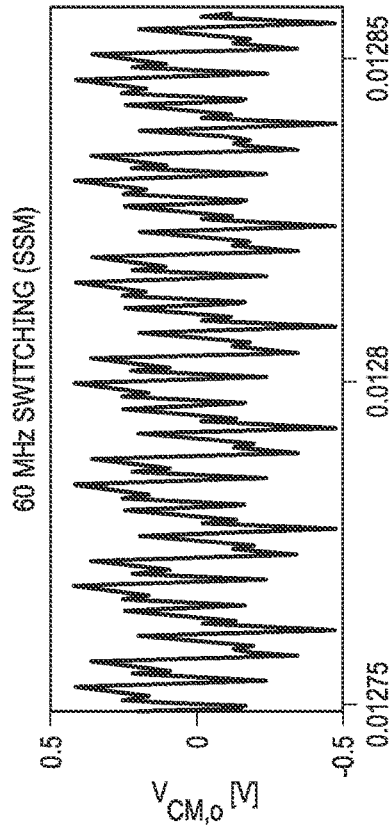
FIG. 15 is a time graph of an example secondary ground voltage of a capacitively-isolated converter like that of FIG. 8A, 9, 10, or 11.

FIGS. 13 and 15 illustrate secondary ground voltages with respect to primary ground voltages for the respective transformer-isolated converter (FIG. 13) and capacitively isolated converter (FIG. 15) circuits. FIG. 15 illustrates the triangular wave of FIG. 8C expected of the capacitively-isolated converter with plus or minus 50 percent mismatch in 2.2 nF Y-rated isolation capacitors, with an approximately half-volt swing, as contrasted to an about 1-volt peak-to-peak swing evident in the transformer-based architecture as shown in FIG. 13. The difference in time scales between FIGS. 13 and 15 further underscore the relatively lower switching frequency able to be employed by the capacitively isolated current-loaded charge pump architecture. Not only is the fundamental frequency of the transformer-based architecture placed at higher frequencies, the harmonics are much higher, whereas the capacitively isolated current-loaded charge pump architectures described herein show substantial dropoff of EMI with a fundamental at a lower frequency. In addition to the above-noted advantages respecting EMI radiation, capacitively isolated current-loaded charge pump architectures described herein (as in FIGS. 8A, 9, 10, and 11) can exceed the efficiency of transformer-based architectures (as in FIGS. 3-5) when $V_{OUT}$ and $V_{IN}$ are close together. Efficiency may be calculated as $V_{OUT}/V_{IN}$, as in a traditional linear regulator, when the capacitively isolated current-loaded charge pump operates in the full-bridge mode. Similarly, efficiency may be calculated as $V_{OUT}/(2V_{IN})$ when the charge pump operates in the half-bridge mode.

Figure 16:
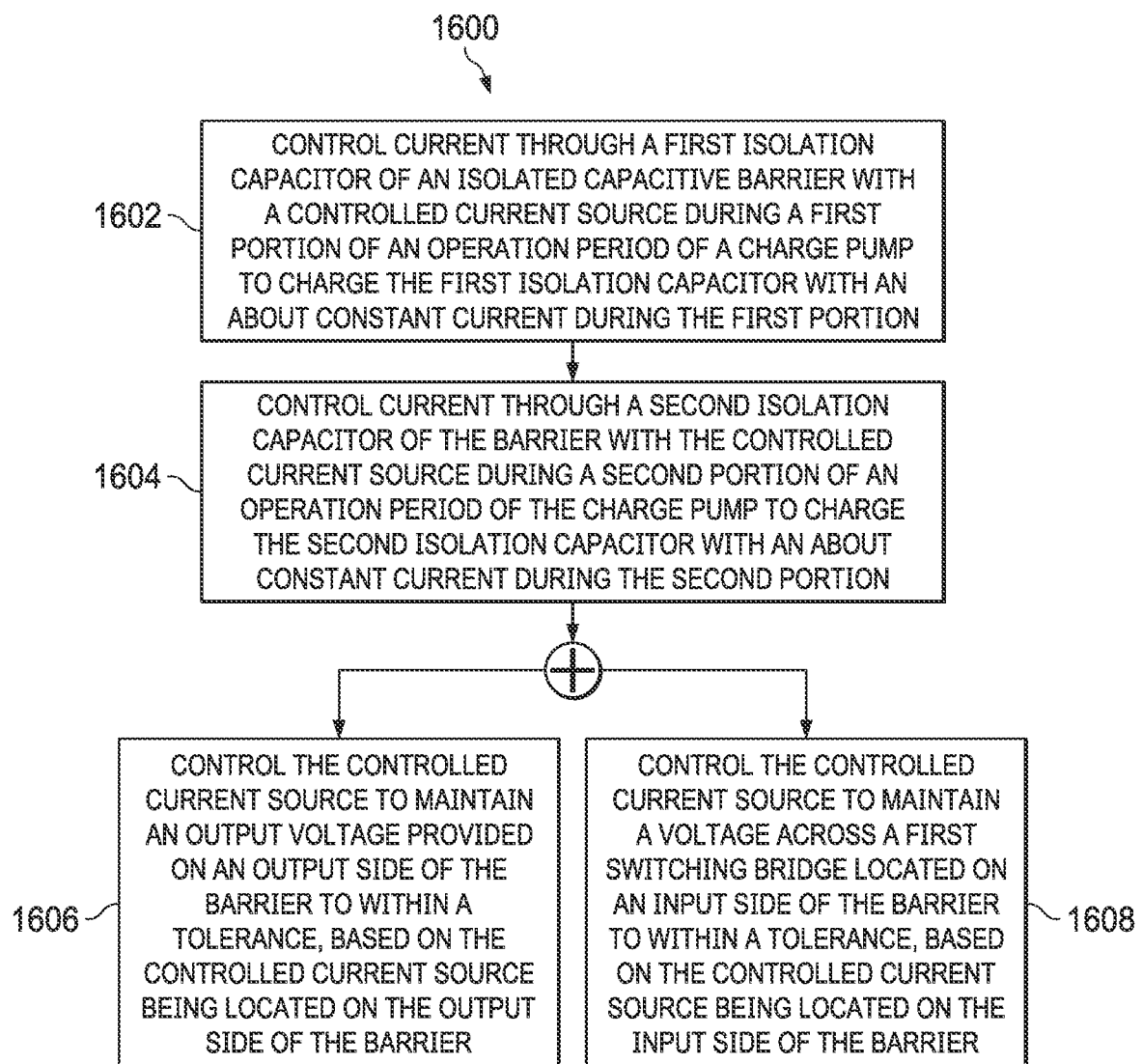
FIG. 16 is a flow chart illustrating an example method of power transfer over an isolated capacitive barrier with controlled current.

FIG. 16 illustrates a method 1600 of power transfer over an isolated capacitive barrier with controlled current. Current through a first isolation capacitor of the barrier is controlled 1602 with a controlled current source during a first portion of an operation period of a charge pump to charge the first isolation capacitor with an about constant current during the first portion. Then, current through a second isolation capacitor of the barrier is controlled 1604 with the controlled current source during a second portion of the operation period of the charge pump to charge the second isolation capacitor with an about constant current during the second portion. During each of the first and second portions of the operation period, one of the following can happen. The controlled current source can be controlled 1606 to maintain an output voltage provided on an output side of the barrier to within a tolerance, based on the controlled current source being located on the output side of the barrier. In such an example, the charge pump can be configured as shown in FIG. 8A or 9. Alternatively, the controlled current source can be controlled 1608 to maintain a voltage across a first switching bridge located on an input side of the barrier to within a tolerance, based on the controlled current source being located on the input side. In such an example, the charge pump can be configured as shown in FIG. 10 or 11.

In some examples, the first switching bridge can be operated as a full bridge and a second switching bridge located on the output side can also be operated as a full bridge such that the output voltage is approximately equal to an input voltage provided by a voltage source on the input side. In other examples, the first switching bridge can be operated as a full bridge and the second switching bridge can be operated as a half bridge such that the output voltage is approximately twice an input voltage provided by a voltage source on the input side (voltage-doubling mode). In either of these examples, the first and second switching bridges can be coordinately switched at a constant switching frequency of less than about 50 MHz. Also in either of these examples, the operation period can be controlled to be constant and greater than about 20 nanoseconds. The method can result, for example, in radiated EMI of less than about 10 dBuV/m in the range of 30 MHz to 1 GHz.

The DC-to-DC converter devices and methods of this description offer greatly reduced EMI when providing cross-isolation-barrier power in low-power applications, as in powering analog front-end-side ADCs in some sensor transmitters. The devices and methods described herein further can offer equal or better power transfer efficiency as compared to transformer-based power transfer architectures. The devices and methods described herein further can place less stress on components, permitting circuits to be designed and fabricated with smaller components. The devices and methods described herein further offer component cost advantages over transformer-based solutions. The devices and methods of this description still further offer layout flexibility as compared to architectures that integrate a laminated transformer on-chip.

In this description, the term "based on" means based at least in part on. In this description, the term "couple" or "couples" means either an indirect or direct wired or wireless connection. Thus, if a first device, element, or component couples to a second device, element, or component, that coupling may be through a direct coupling or through an indirect coupling via other devices, elements, or components and connections. Similarly, a device, element, or component that is coupled between a first component or location and a second component or location may be through a direct connection or through an indirect connection via other devices, elements, or components and/or couplings. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is described herein to include certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure either at a time of manufacture or after a time of manufacture, for example, by an end-user and/or a third-party.

Modifications are possible in the described embodiments, and other embodiments are possible, within the scope of the claims.

What is claimed is:

1. A capacitively isolated current-loaded charge pump circuit configured to transfer electrical energy from a primary side to a secondary side over a capacitive isolation boundary, the charge pump circuit comprising:
   an input capacitor coupled at a first end to a primary upper terminal and at a second end to a primary ground terminal on the primary side;
   an output capacitor coupled at a first end to a secondary upper terminal and at a second end to a secondary ground terminal on the secondary side;
   a primary switching bridge on the primary side, the primary switching bridge comprising a first primary switch coupled to a second primary switch at a first primary terminal and a third primary switch coupled to a fourth primary switch at a second primary terminal;
   a secondary switching bridge on the secondary side, the secondary switching bridge comprising a first secondary switch coupled to a second secondary switch at a first secondary terminal and a third secondary switch coupled to a fourth secondary switch at a second secondary terminal;

a first isolation capacitor coupled at a first end to the first primary terminal and at a second end to the first secondary terminal;
a second isolation capacitor coupled at a first end to the second primary terminal and at a second end to the second secondary terminal; and
at least one of:
a secondary-side controlled current source coupled between the secondary switching bridge and the output capacitor and configured to maintain an output voltage across the output capacitor to within a tolerance, and to maintain current through the first and second isolation capacitors as a square wave, or
a primary-side controlled current source coupled between the primary switching bridge and the input capacitor and configured to maintain a primary-side voltage across the primary switching bridge to within a tolerance, and to maintain current through the first and second isolation capacitors as a square wave;
the primary and secondary switching bridges being configured to coordinately switch to transfer electrical energy from the primary side to the secondary side.

2. The charge pump circuit of claim 1, wherein the first and second isolation capacitors are Y-rated capacitors.

3. The charge pump circuit of claim 1, comprising the secondary-side controlled current source, wherein the controlled current source comprises a single field-effect transistor (FET) having a gate coupled to control circuitry configured to control a gate-source bias of the single FET to maintain the output voltage across the output capacitor and to maintain the current through the first isolation capacitor as a square wave.

4. The charge pump circuit of claim 3, further comprising a decoupling capacitor coupled at a first end to the source of the single FET and coupled at a second end to the secondary ground terminal, the capacitance of the decoupling capacitor being between about one hundredth the capacitance value of the output capacitor and about one tenth the capacitance value of the output capacitor.

5. The charge pump circuit of claim 1, comprising the controlled current source coupled between the primary switching bridge and the input capacitor, wherein the controlled current source comprises a first and second field-effect transistors (FETs) each having a gate coupled to control circuitry configured to control respective gate-source biases of the first and second FETs to maintain the primary-side voltage across the primary switching bridge, and to maintain the current through the first isolation capacitor as a square wave, and wherein:
a drain of the first FET is coupled to the power output of the power supply circuitry;
a source of the first FET is coupled to a top terminal of the primary switching bridge;
a drain of the second FET is coupled to a bottom terminal of the primary switching bridge; and
a source of the second FET is coupled to the primary ground terminal.

6. The charge pump circuit of claim 1, wherein the charge pump circuit radiates electromagnetic interference (EMI) of less than about 10 dBuV/m in the range of 30 MHz to 1 GHz.

7. A sensor transmitter comprising the capacitively isolated current-loaded charge pump circuit of claim 1, wherein an output of the capacitively isolated current-loaded charge pump circuit is coupled to an analog-to-digital converter (ADC) in the sensor transmitter and configured to supply power to the ADC, the ADC being configured to convert an analog signal from a sensor integrated with or coupled to the sensor transmitter into a digital signal.

8. A method of power transfer over an isolated capacitive barrier with controlled current, the method comprising:
controlling current through a first isolation capacitor of the barrier with a controlled current source during a first portion of an operation period of a charge pump to charge the first isolation capacitor with an about constant current during the first portion;
controlling current through a second isolation capacitor of the barrier with the controlled current source during a second portion of the operation period of the charge pump to charge the second isolation capacitor with an about constant current during the second portion; and
during each of the first and second portions of the operation period, one of:
controlling the controlled current source to maintain an output voltage provided on an output side of the barrier to within a tolerance, based on the controlled current source being located on the output side of the barrier, or
controlling the controlled current source to maintain a voltage across a first switching bridge located on an input side of the barrier to within a tolerance, based on the controlled current source being located on the input side.

9. The method of claim 8, further comprising operating the first switching bridge as a full bridge and operating a second switching bridge located on the output side as a full bridge such that the output voltage is approximately equal to an input voltage provided by a voltage source on the input side.

10. The method of claim 9, wherein the first and second switching bridges are coordinately switched at a constant switching frequency of less than about 50 MHz.

11. The method of claim 8, further comprising operating the first switching bridge as a full bridge and operating a second switching bridge located on the output side as a half bridge such that the output voltage is approximately twice an input voltage provided by a voltage source on the input side.

12. The method of claim 11, wherein the first and second switching bridges are coordinately switched at a constant switching frequency of less than about 50 MHz.

13. The method of claim 8, wherein the operation period is constant and greater than about 20 nanoseconds.

14. The method of claim 13, wherein the method results in radiated electromagnetic interference (EMI) of less than about 10 dBuV/m in the range of 30 MHz to 1 GHz.

15. The method of claim 8, further comprising:
providing electrical power transferred over the isolated capacitive barrier to an analog-to-digital converter (ADC) coupled to the output side;
converting, via the ADC, an analog signal from a sensor integrated in or coupled to a sensor transmitter into a digital signal;
providing the digital signal to the input side across the barrier; and
transmitting the digital signal or a signal based on the digital signal from the input side.

* * * * *